United States Patent
Park

(10) Patent No.: US 9,438,247 B2
(45) Date of Patent: Sep. 6, 2016

(54) APPARATUS FOR SIMPLIFICATION OF INPUT SIGNAL

(71) Applicant: LSIS CO., LTD., Anyang-si, Gyeonggi-do (KR)

(72) Inventor: Kang Hee Park, Cheonan-si (KR)

(73) Assignee: LSIS CO., LTD., Anyang-si (KR)

( * ) Notice: Subject to any disclaimer, the term of this patent is extended or adjusted under 35 U.S.C. 154(b) by 103 days.

(21) Appl. No.: 14/567,816

(22) Filed: Dec. 11, 2014

(65) Prior Publication Data

US 2015/0180478 A1 Jun. 25, 2015

(30) Foreign Application Priority Data

Dec. 19, 2013 (KR) .................... 10-2013-0159121

(51) Int. Cl.
*H03K 21/02* (2006.01)
*H03K 5/1534* (2006.01)

(52) U.S. Cl.
CPC .......... *H03K 21/026* (2013.01); *H03K 5/1534* (2013.01)

(58) Field of Classification Search
CPC ...................................................... H03K 21/02
See application file for complete search history.

(56) References Cited

U.S. PATENT DOCUMENTS 8,594,214 B2 * 11/2013 Lee ...................... G05B 19/054
  375/260
8,705,687 B2 * 4/2014 Kim ................... G05B 19/0423
  377/111

* cited by examiner

*Primary Examiner* — Hai L Nguyen
(74) *Attorney, Agent, or Firm* — Lee, Hong, Degerman, Kang & Waimey PC; Jonathan Kang; Justin Lee

(57) ABSTRACT

The present disclosure relates to an apparatus for simplification of input signal configured to simplify a process of microprocessor and to enhance a speed by transforming six input modes of 1-phase/2-input/1-multiplication mode, 1-phase/2-input/2-multiplication mode, CW/CCW mode, 2-phase/1-multiplication mode, 2-phase/2-multiplication mode and 2-phase/4-multiplication mode to a same shape according to types of encoder connected to a PLC high speed counter, and transmitting to the microprocessor, and by adding the six types of input modes to a logic gate circuit of a high speed counter input circuit.

7 Claims, 16 Drawing Sheets

| ADDITION/DEDUCTION COUNT CLASSIFICATION | A PHASE PULSE RISE | A PHASE PULSE FALL |
|---|---|---|
| PHASE OF A PHASE AND PHASE OF B PHASE (A PHASE - B PHASE) | ADDITION COUNT(+1) | — |
| PHASE OF A PHASE AND PHASE OF B PHASE (B PHASE - A PHASE) | — | DEDUCTION COUNT(-1) |

| ADDITION/DEDUCTION COUNT CLASSIFICATION | A PHASE PULSE RISE | A PHASE PULSE FALL |
|---|---|---|
| PHASE OF A PHASE AND PHASE OF B PHASE (A PHASE - B PHASE) | ADDITION COUNT(+1) | ADDITION COUNT(+1) |
| PHASE OF A PHASE AND PHASE OF B PHASE (B PHASE - A PHASE) | DEDUCTION COUNT(-1) | DEDUCTION COUNT(-1) |

| INPUTS | | | OUTPUTS | |
|---|---|---|---|---|
| $n\overline{R}_D$ | $n\overline{A}$ | nB | nQ | $n\overline{Q}$ |
| L | X | X | L | H |
| X | H | X | L[2] | H[2] |
| X | X | L | L[2] | H[2] |
| H | L | ↑ | ⊓ | ⊔ |
| H | ↓ | H | ⊓ | ⊔ |

| OE | EX | A1 | B1 | C1 | D1 | Function |
|---|---|---|---|---|---|---|
| H | X | \multicolumn{4}{c|}{HI-Z} | Disconnect |
| L | L | \multicolumn{4}{c|}{A1 - C1, B1 - D1} | Connect |
| L | H | \multicolumn{4}{c|}{A1 - D1, B1 - C1} | Exchange |

| MODE | PLS_EN0 | PLS_EN1 | PLS_EN2 | DIR_CTRL0 | DIR_CTRL1 | BLOCK_CTRL0 | BLOCK_CTRL1 | BLOCK_CTRL2 |
|---|---|---|---|---|---|---|---|---|
| FIRST MODE | 1 | 0 | 0 | 1 | 0 | 1 | 0 | 1 |
| SECOND MODE | 1 | 0 | 0 | 1 | 0 | X (ARBITRARY VALUE) | X (ARBITRARY VALUE) | 0 |
| THIRD MODE | 0 | 1 | 0 | 1 | 0 | 1 | 0 | 1 |
| FOURTH MODE | 1 | 0 | 0 | 0 | 1 | 0 | 1 | 1 |
| FIFTH MODE | 1 | 0 | 0 | 0 | 1 | X (ARBITRARY VALUE) | X (ARBITRARY VALUE) | 0 |
| SIXTH MODE | 1 | 1 | 1 | 0 | 1 | X (ARBITRARY VALUE) | X (ARBITRARY VALUE) | 0 |

APPARATUS FOR SIMPLIFICATION OF INPUT SIGNAL

Pursuant to 35 U.S.C. §119 (a), this application claims the benefit of earlier filing date and right of priority to Korean Patent Application No. 10-2013-0159121, filed on Dec. 19, 2013, the contents of which are hereby incorporated by reference in their entirety.

BACKGROUND OF THE DISCLOSURE

1. Field of Endeavor

Exemplary embodiments of the present disclosure generally relate to an apparatus for simplification of input signal.

2. Background

The information disclosed in this Discussion of the Related Art section is only for enhancement of understanding of the general background of the present disclosure and should not be taken as an acknowledgement or any form of suggestion that this information forms the prior art already known to a person skilled in the art.

Generally, a high speed counter module of PLC (Programmable Logic Controller) is a module configured to function to count a fast pulse signal of a pulse generator or an encoder that cannot be counted by a general counter command.

FIG. 1 is a block diagram illustrating a configuration of a PLC high speed counter according to prior art.

Referring to FIG. 1, an input circuit (20) converts a high speed pulse signal generated by an encoder (10) to CMOS level signal for transmission to an outside interrupt port of an MPU (Micro Processor Unit, 30). The MPU (30) adds, deducts or disregards without any operation, a current value in response to a pulse input mode of the encoder (10) when a signal of the outside interrupt port connected to the input circuit (20) rises or falls, i.e., at a rising edge or a falling edge.

FIG. 2 is a block diagram illustrating an input circuit (20) of a PLC high speed counter according to prior art.

Referring to FIG. 2, signals of A-phase and B-phase of encoder (10) from outside connector is converted to a CMOS signal, which is in turn transmitted to A-phase and B-phase outside interrupt ports of MPU (30).

FIGS. 3a and 3f are schematic views illustrating six different input modes and operations thereof according to types of encoder (10). Hereinafter, a first mode refers to 1-phase/2-input/1-multiplication mode, a second mode refers to 1-phase/2-input/2-multiplication mode, a third mode refers to CW (Clockwise)/CCW (Counterclockwise) mode, a fourth mode refers to 2-phase/1-multiplication, a fifth mode refers to 2-phase/2-multiplication, and a sixth mode refers to 2-phase/4-multiplication, for convenience sake. The detailed operation of the first to sixth modes will be explained later.

FIG. 4 is a flow chart illustrating a flow of processing an interrupt according to prior art when the interrupt is generated in an outside interrupt ports of MPU (30) in the PLC high speed counter. FIG. 4a illustrates a case where an interrupt is generated on A phase, and FIG. 4b illustrates a case where an interrupt is generated on B phase.

Referring to FIGS. 4a and 4b, when an interrupt is generated on A phase, the MPU (30) operates in a method of determining by repeating at every time at which mode among first to sixth modes the interrupt is generated. Furthermore, when an interrupt is generated on B phase, the MPU (30) operates in a method of determining by repeating at every time at which mode between third mode and sixth mode the interrupt is generated. Thus, when an interrupt is generated, the MPU (30) determines by repeating at every time to what mode an input mode corresponds.

Meantime, the MPU (30) temporarily stops the PLC scan program whenever a rising edge or a falling edge of an input signal connected to an outside interrupt port is detected, and performs a high speed counter processing routine after the interrupt is generated. Thus, when an edge of an input mode is detected according to the prior art, an interrupt processing time is lengthened in response to the performance of process shown in FIGS. 4a and 4b according to the input mode, and when a speed of input pulse string (train) increases, the resources of MPU is excessively and disadvantageously occupied due to delay in interrupt processing. Another disadvantage as a result thereof is that the processing speed of PLC scan program is slowed.

SUMMARY

The present disclosure has been made to solve the foregoing disadvantages/problems of the prior art and therefore an object of certain embodiments of the present invention is to provide an apparatus for simplification of input signal.

In one general aspect of the present disclosure, there is provided an apparatus for simplification of input signal configured to input, to an MPU (Micro Processing Unit), an output of an input circuit at a PLC high speed counter module by converting the input to a single signal, the apparatus comprising:

a first detector configured to output a single pulse in response to a rising edge or a falling edge by detecting the rising edge or the falling edge of a reference signal, which is a reference of adding or deducting calculation in response to an operation mode of the high speed counter module;

a second detector configured to detect, from an output of the first detector, a pulse of rising edge or falling edge configured to perform an actual adding or deducting calculation in response to an operation mode of the high speed counter module; and a switching unit configured to output an output of the second detector using the adding or deducting calculation.

Preferably, but not necessarily, the first detector may include a first oscillation unit configured to output a signal pulse by detecting a rising edge of a first input, a second oscillation unit configured to output a signal pulse by detecting a falling edge of a first input, a third oscillation unit configured to output a signal pulse by detecting a rising edge of a second input, a fourth oscillation unit configured to output a signal pulse by detecting a falling edge of a second input, and an edge detector configured to detect only an output of a reference signal from the first to fourth oscillation units in response to the operation mode.

Preferably, but not necessarily, the operation mode may include any one mode of a first mode of 1-phase/2-input/1-multiplication method, a second mode of 1-phase/2-input/2-multiplication method, a third mode of CW/CCW method, a fourth mode of 2-phase/1-multiplication method, a fifth mode of 2-phase/2-multiplication method and a sixth mode of 2-phase/4-multiplication method.

Preferably, but not necessarily, the switching unit may include a 2-bit switch configured to perform a one-on-one connection or a cross connection in response to a control signal by receiving a 2-bit input, and a switch controller configured to control the 2-bit switch by outputting through adding or deducting calculation in response to the operation mode.

Preferably, but not necessarily, a control signal may be transmitted to the first, second detectors and the switching unit by using a general output port of the MPU.

Preferably, but not necessarily, the edge detector may remove an input which is not a reference signal in response to the operation mode.

Preferably, but not necessarily, the edge detector may combine outputs corresponding to the reference signal in response to the operation mode.

The apparatus for simplification of input signal according to the present disclosure has an advantageous effect in that interrupt processing of MPU can be simplified by simplification of high speed counter input signal. Another advantageous effect is that processing speed of adding or deducting calculation can be enhanced by simplification of interrupt process of the MPU.

Still another advantageous effect is that efficiency of MPU can be increased and interrupt process routine can be much simplified by selective transmission of only a pulse string to be transmitted per input mode in response to operation of mono-stable multi-vibrator and simple logic circuit.

BRIEF DESCRIPTION OF THE DRAWINGS

The drawings show one or more exemplary embodiments in accordance with the present concepts, by way of example only, not by way of limitations. In the figures, like reference numerals refer to the same or similar elements.

Thus, a wide variety of potential practical and useful embodiments will be more readily understood through the following detailed description of certain exemplary embodiments, with reference to the accompanying exemplary drawings in which.

DETAILED DESCRIPTION

Various exemplary embodiments will be described more fully hereinafter with reference to the accompanying drawings, in which some exemplary embodiments are shown. The present inventive concept may, however, be embodied in many different forms and should not be construed as limited to the example embodiments set forth herein. Rather, the described aspect is intended to embrace all such alterations, modifications, and variations that fall within the scope and novel idea of the present disclosure.

Hereinafter, exemplary embodiments of the present disclosure will be described in detail with reference to the accompanying drawings.

Figure 1:
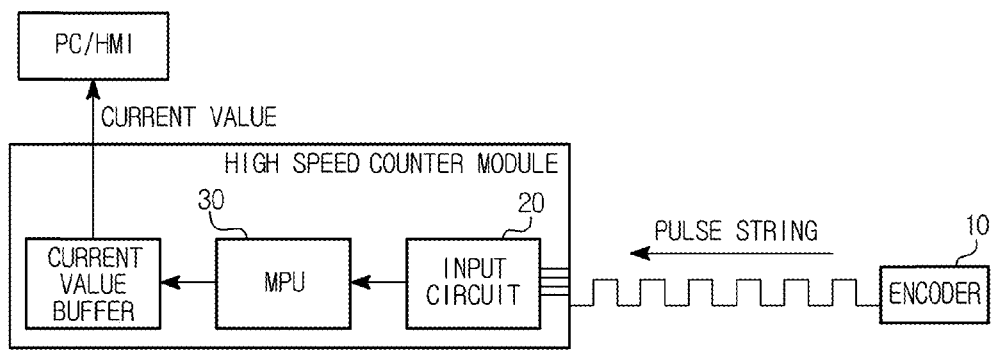
FIG. 1 is a configurative block diagram illustrating a PLC high speed counter according to prior art.

The input signal simplification device according to an exemplary embodiment of the present disclosure is applied to a PLC high speed counter to enhance a processing speed by simplifying signals of 6 types of modes. Thus, operations of 6 types of modes in MPU (30) of FIG. 1 will be described in detail in the first place.

FIGS. 3a to 3f, as explained in the foregoing, are schematic views illustrating six different input modes and operations thereof according to types of encoders.

Figure 3A:
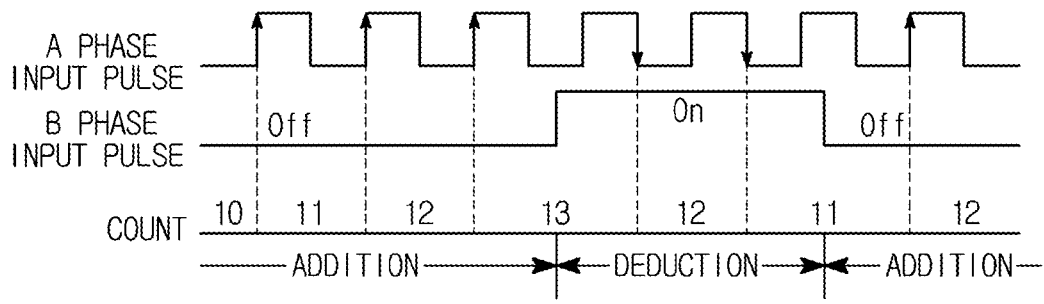
FIGS. 3a to 3f are schematic views illustrating six different input modes and operations thereof according to types of encoders.

FIG. 3a illustrates a first mode of 1-phase/2-input/1-multiplication method, where a counter is added when a B-phase input pulse is OFF, and a rising edge is generated on A phase, and a counter is deducted when a B-phase input pulse is ON, and a falling edge is generated on A phase.

Figure 3B:
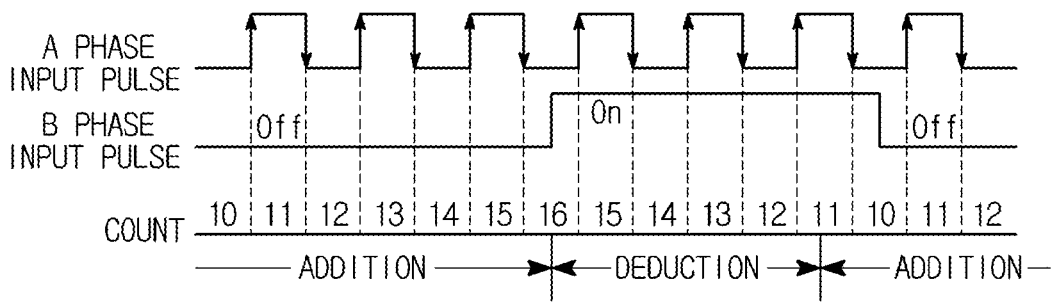

FIG. 3b illustrates a second mode of 1-phase/2-input/2-multiplication method, where a counter is added when a B-phase input pulse is OFF, and a rising edge is generated on A phase, a counter is added, and a counter is deducted when a falling edge is generated. Furthermore, a counter is deducted when a B-phase input pulse is ON and a rising edge is generated on A phase, and a counter is added when a falling edge is generated.

Figure 3C:
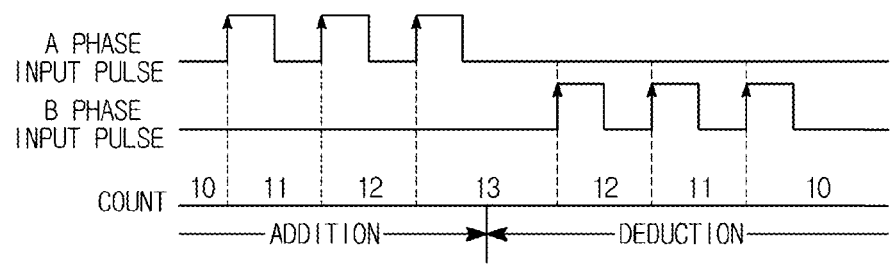

FIG. 3c illustrates a third mode of CW/CCW method, where a counter is added only when a B-phase input pulse is OFF, and a rising edge is generated on A phase, and a counter is deducted only when a A-phase input pulse is OFF, and a rising edge is generated on B phase.

Figure 3D:
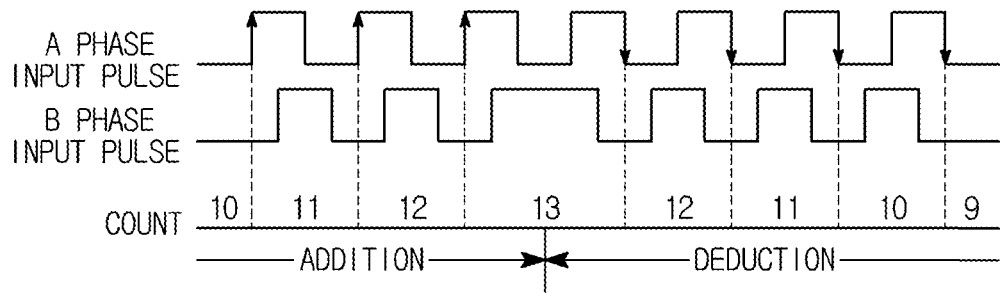

FIG. 3d illustrates a fourth mode of 2-phase/1-multiplication method, where a counter is added when a rising edge is generated on A phase and phase of A phase is ahead by calculating a phase difference between phases of A phase and B phase, and a counter is deducted when a falling edge is generated and phase of B phase is ahead.

Figure 3E:
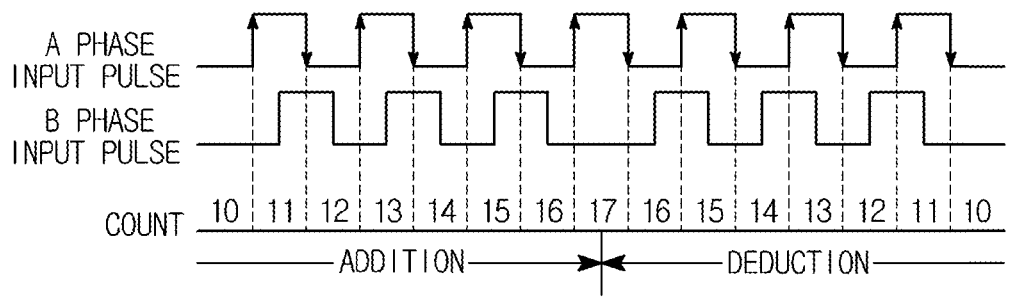

FIG. 3e illustrates a fifth mode of 2-phase/2-multiplication method, where a counter is added when a rising edge is generated on A phase and phase of A phase is ahead by calculating a phase difference between phases of A phase and B phase, and a counter is deducted when a falling edge is generated. Furthermore, a counter is deducted when a rising edge is generated on A phase and phase of B phase is ahead, and a counter is deducted when a falling edge is generated.

Figure 3F:
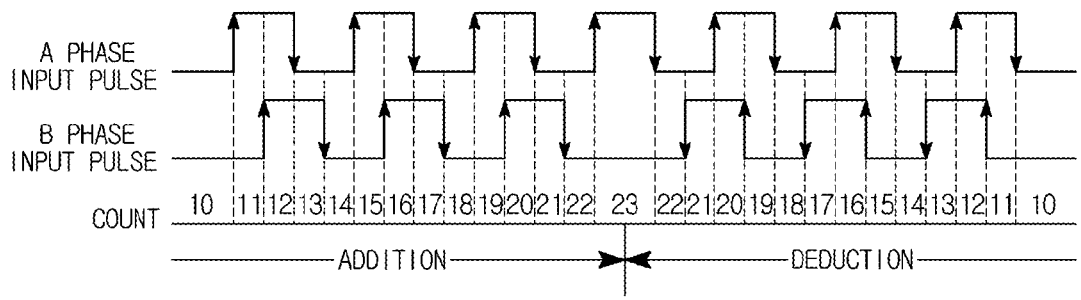
Figure 4A:
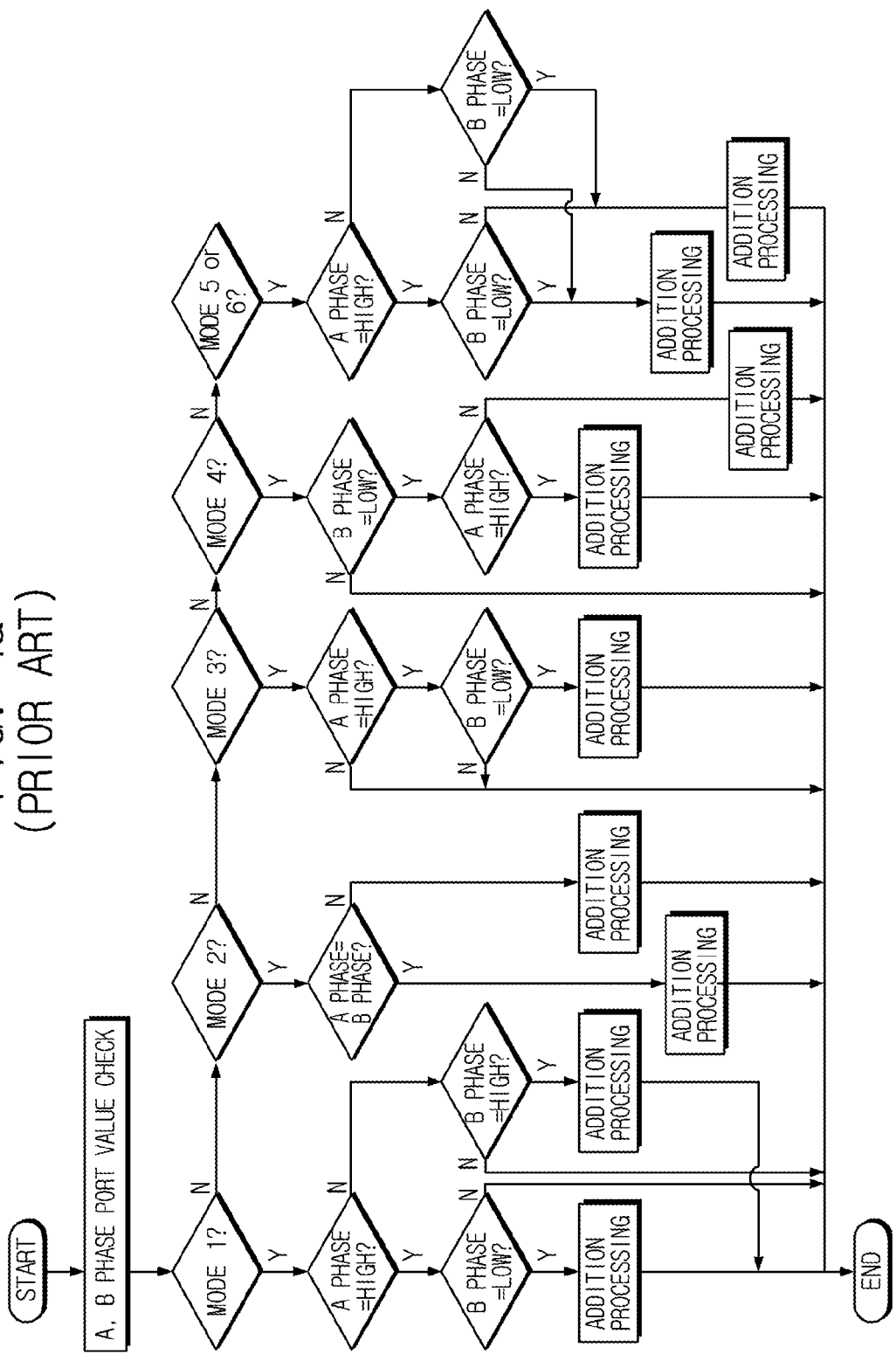
FIGS. 4a and 4b are flow charts illustrating flows of processing a conventional interrupt when an interrupt is generated on an outside interrupt port of MPU (30) in a PLC high speed counter.
Figure 4B:
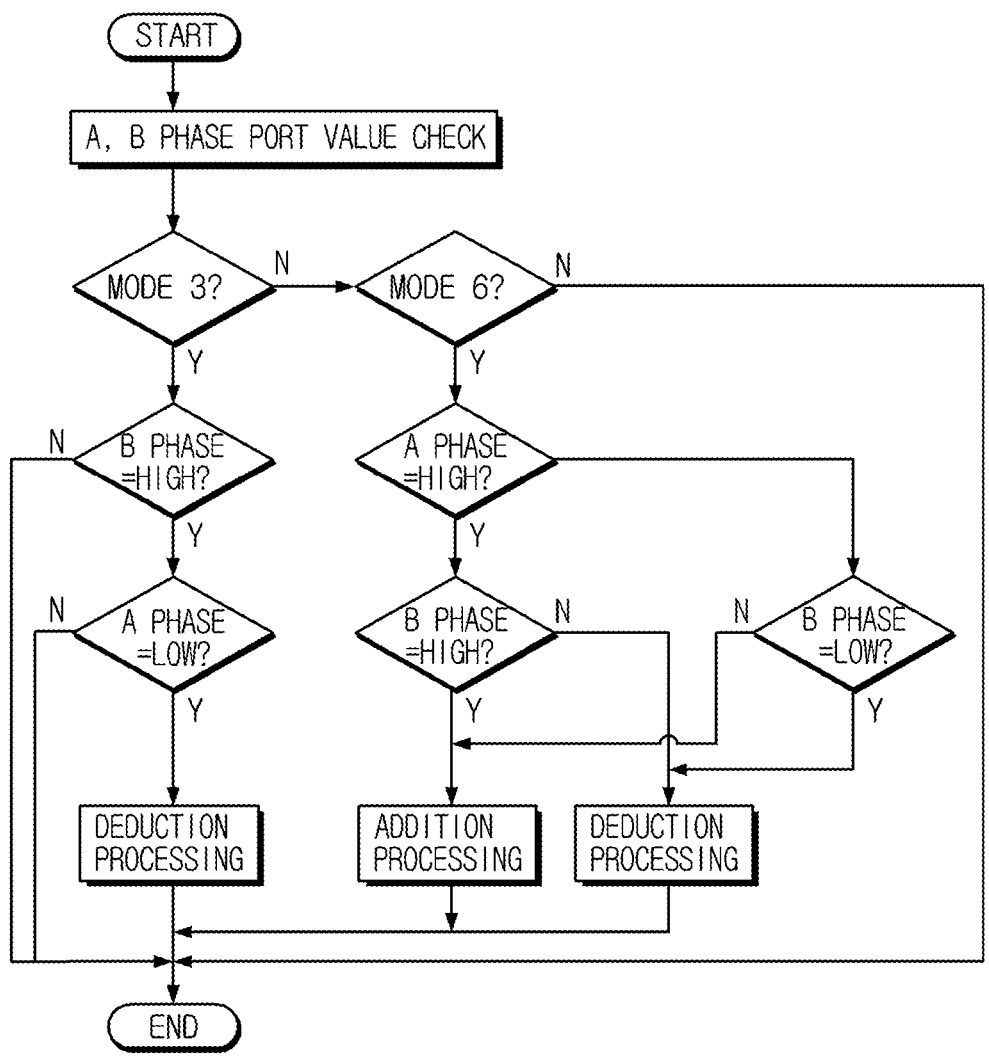

FIG. 3f illustrates a sixth mode of 2-phase/4-multiplication method, where a counter is added whenever a rising or falling edge is generated on A phase or B phase, and phase of A phase is ahead by calculating a phase difference between phases of A phase and B phase, and a counter is deducted whenever a rising or falling edge is generated on A phase or B phase, and phase of B phase is ahead.

The abovementioned first to sixth modes are different in conditions for performing the adding or deducting calculation for each mode. However, for each mode, classification can be made between a reference signal for determining whether to perform the addition or deduction and a state signal for determining the conditions for performing the adding or deducting calculation.

In case of the first, second, fourth and fifth modes, adding or deducting calculation is performed only when a rising edge or a falling edge is generated on A phase, such that a signal on A phase is a reference signal. Furthermore, the condition for performing the adding or deducting calculation is changed depending on ON/OFF of B phase signal for the first and second modes, the B phase signal is a state signal.

In case of third and sixth modes, the adding or deducting calculation is performed even in case of rising edge or falling edge of B phase, both signals on A phase and B phase are all reference signals. In case of third to sixth modes, the state condition of performing the adding or deducting calculation is determined by A phase and B phase signals, the state signal is A phase and B phase signals.

Figure 5:
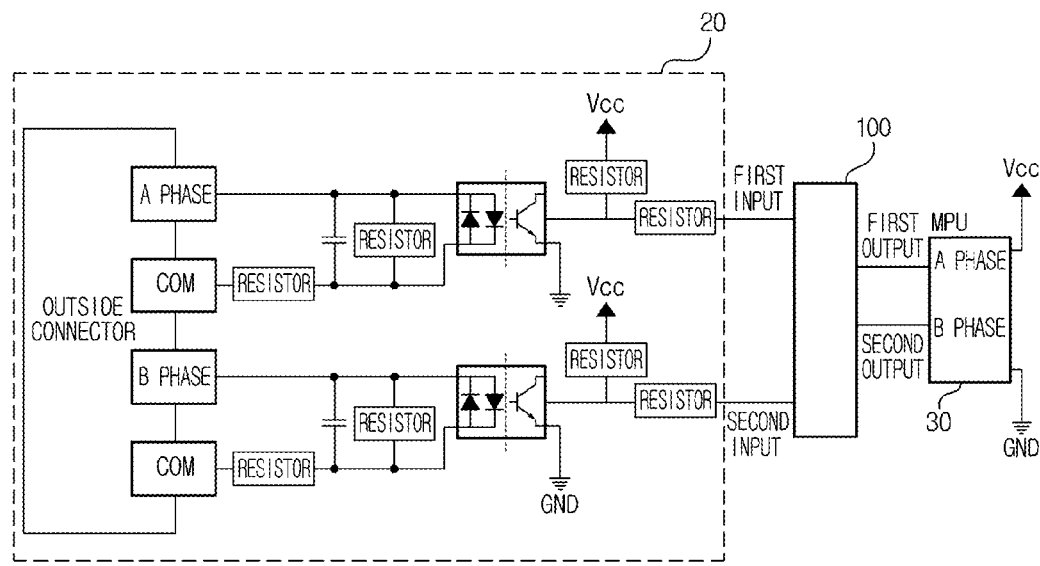
FIG. 5 is a configurative schematic view illustrating a PLC high speed counter included with an apparatus for simplification of input signal according to an exemplary embodiment of the present disclosure.

FIG. 5 is a schematic view illustrating a structure of a PLC high speed counter included with an apparatus (100) for simplification of input signal according to an exemplary embodiment of the present disclosure.

Figure 2:
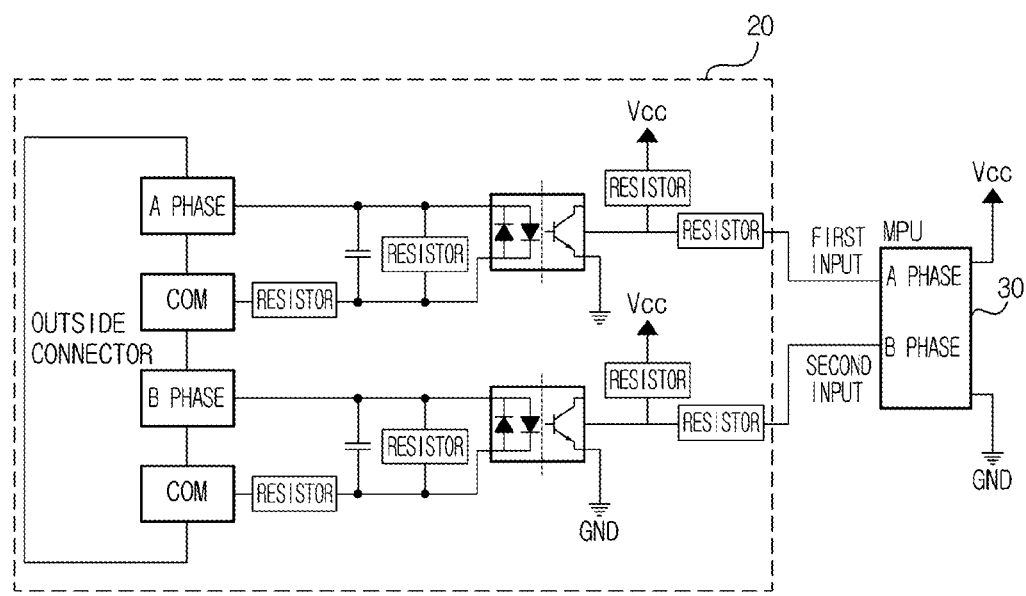
FIG. 2 is a general configurative block diagram illustrating an input circuit (20) in a PLC high speed counter according to prior art.

Referring to FIG. 5, an apparatus (100, hereinafter simply referred to as apparatus) according to the present disclosure is interposed between the input circuit (20) of FIG. 2 and MPU (30) to receive A phase and B phase signals from the input circuit (20), where the abovementioned 6 types of modes are converted to a single mode, and a single pulse may be generated on the A phase when addition is required, and a single pulse may be generated on the B phase when deduction is required, whereby input signal of MPU (30) can be simplified. Hereinafter, A phase signal of the input circuit (20) outputted by converting a high speed pulse signal of encoder to CMOS level is defined as a first input, and B phase signal is defined as a second input.

Figure 6:
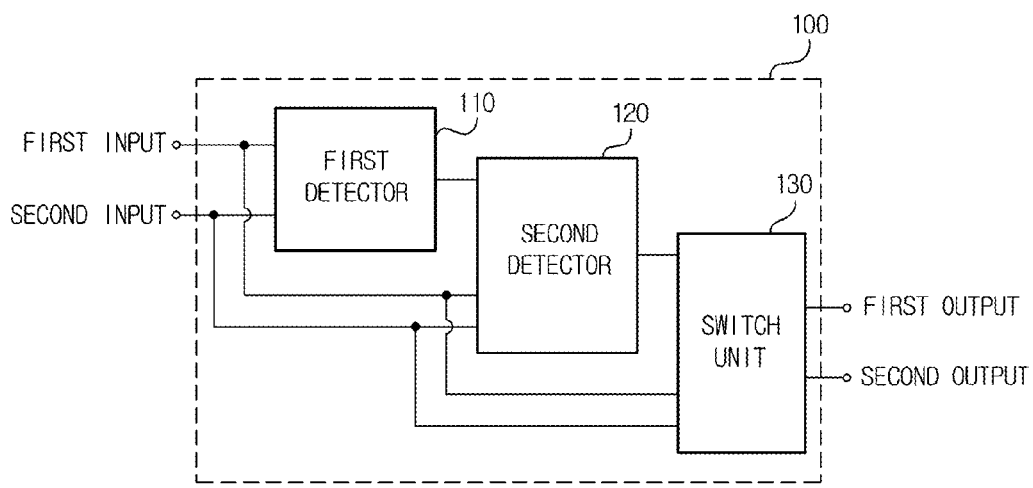
FIG. 6 is a configurative block diagram illustrating an apparatus (100) for simplification of input signal according to an exemplary embodiment of the present disclosure.

FIG. 6 is a configurative block diagram illustrating the apparatus (100) according to an exemplary embodiment of the present disclosure.

Referring to FIG. 6, the apparatus may include a first detector (110), a second detector (120) and a switch unit (130).

The first detector (110) may detect a rising edge and a falling edge from the first input and second input. A single pulse signal may be generated and outputted for each detected edge, where an output of the first detector (110) may be used as an input signal of the second detector (120). The second detector (120) may detect an edge configured to actually perform an adding or deducting calculation in the rising and falling edges detected by the first detector (110). The first input, the second input, and an output of the first detector may be inputted to the second detector (120). The switching unit (130) may output, as a first output when in addition, and as a second output when in deduction, an edge configured to perform an adding or deducting calculation determined by the second detector (120).

Figures 7A, 7B:
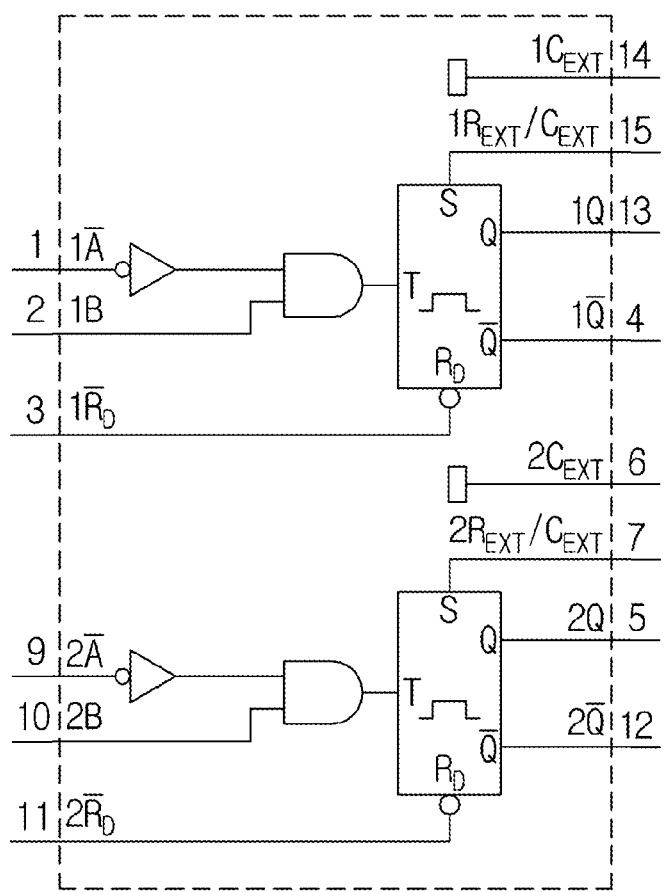
FIGS. 7a and 7b are schematic views illustrating each inner structure of first to fifth oscillation units (111, 112, 113, 114, 115) used in an apparatus (100) for simplification of input signal according to the present disclosure.
Figure 9:
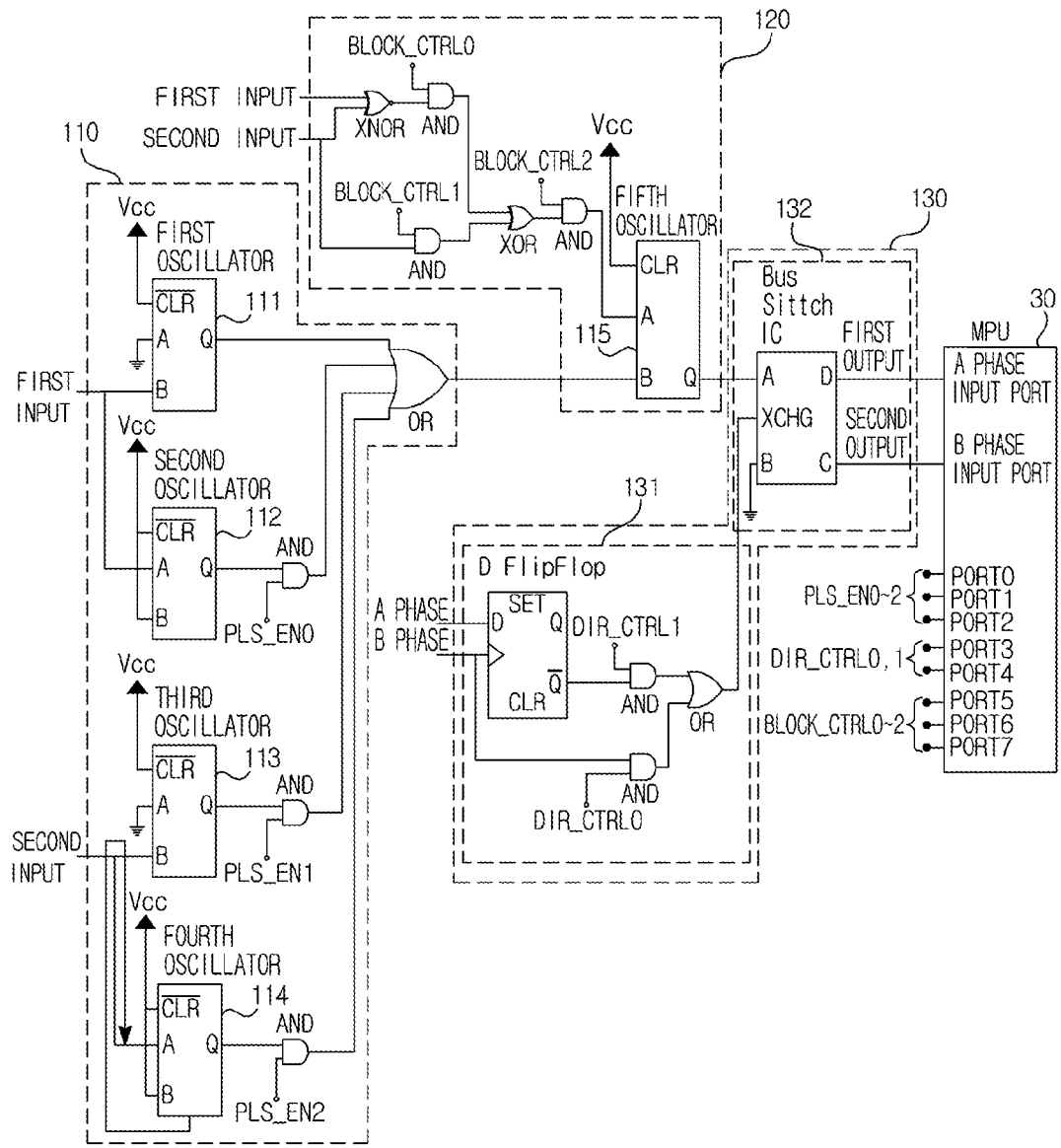
FIG. 9 is a schematic view illustrating an inner circuit of an apparatus (100) for simplification of input signal according to an exemplary embodiment of the present disclosure.

FIGS. 7a and 7b are schematic views illustrating each inner structure of first to fifth oscillation units (111, 112, 113, 114, 115) used in the apparatus (100) for simplification of input signal according to the present disclosure illustrated in FIG. 9.

Referring to FIGS. 7a and 7b, in case an input on A phase is low and when a rising edge on B phase is generated, an output Q may be outputted once (one shot pulse), and in case an input of B phase is high and when a falling edge is generated on the input of A phase, the output Q may be outputted once (one shot pulse). Thus, a rising edge or a falling edge of each phase can be detected by using the oscillation unit of the present disclosure. Furthermore, exemplary embodiments of first to fifth oscillation units may be mono-stable (single-shot) multi-vibrators.

Figures 8A, 8B:
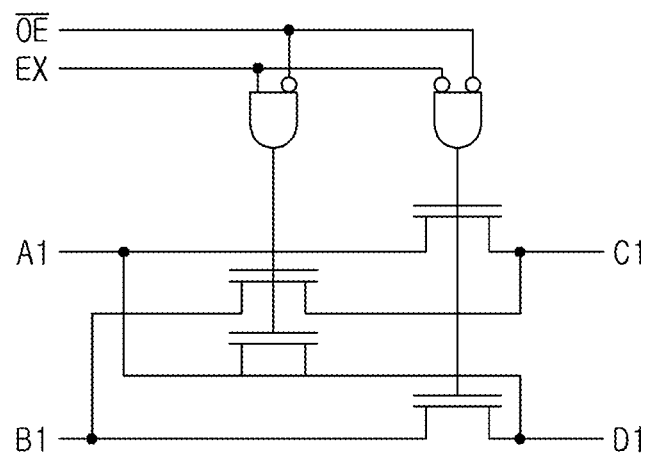
FIGS. 8a and 8b are schematic views illustrating an inner structure of 2-bit switch (132) of a switch unit (130) in an apparatus (100) for simplification of input signal and a truth table according to the present disclosure.

FIGS. 8a and 8b are schematic views illustrating an inner structure of 2-bit switch (132) of a switch unit (130) in an apparatus (100) for simplification of input signal and a truth table according to the present disclosure.

The 2-bit switch (132) according to the present disclosure operates in such a manner that when an OE signal is low, input/output ports are connected in a one-on-one base or a crossed base according to an EX signal. To be more specific, the 2-bit switch (132) is connected on a one-on-one base when the EX signal is low, and connected on a crossed base when the EX signal is high.

FIG. 9 is a schematic view illustrating an inner circuit of an apparatus (100) for simplification of input signal according to an exemplary embodiment of the present disclosure.

Referring to FIG. 9, each element will be described in detail in the following manner.

The first detector (110) may output one single signal by receiving a first input and a second input. The first detector (110) may detect all rising and falling edges of a reference signal, which is a deduction or an addition reference, in response to first to sixth modes of input signal of the PLC high speed counter.

The first detector may output a single pulse for each rising edge and each falling edge of the reference signal which is a deduction or an addition reference.

To be more specific, in case of first mode, a second mode, a fourth mode and a fifth mode, the count is added or deducted in response to the falling or rising edge of the first input (A phase). In other words, an output of the first detector (110) may be a single pulse signal outputted at every rising or falling edge of the first input (A input), because a signal of the first input (A phase) is the reference signal.

Although a detailed circuit of the first detector (110) may be variably realized depending on used logic circuit elements, the detailed circuit of the first detector (110) of the present disclosure has been realized using four oscillation units and logic element gates, a detailed operation of which is described in detail in the following manner.

A first oscillation unit (111) may detect a rising edge of the first input (A phase) signal and output a single pulse at every edge, and the second oscillation unit (112) may detect a falling edge of the first input (A phase) signal and output a single pulse at every detected edge. A third oscillation unit (113) may detect a rising edge of the second input (B phase) signal and output a single pulse at edge, and a fourth oscillation unit (114) may detect a falling edge of the second input (B phase) signal and output a single pulse at every detected edge.

Any signal, which is not a reference for addition or deduction for each first to sixth mode thus described among the rising or falling edge signals detected by the first to fourth oscillation units (111, 112, 113, 114), may not be outputted using AND gate. The single pulse signal generated at every rising or falling edge of the signal, which is a reference for addition and deduction, may be outputted through AND gate, and the single pulse signals outputted through the AND gate may become an output of the first detector (110) by being combined as one single signal by OR gate.

The second detector (120) may output a pulse string having extracted the rising or falling edge for actually performing the addition or deduction calculation, using the first and second inputs and output of the first detector (110) as inputs. To be more specific, the second detector (120) can extract a case of actually performing the addition or deduction calculation in response to each operation mode of the PLC high speed counter among all rising or falling edges of reference signal which is a reference of addition or deduction inputted from the first detector (110). The second detector (120) can extract only the pulse that actually performs the addition or deduction through state signal information that shows a condition for actually realizing the addition or the deduction from the first input and the second input.

Now, a configuration of the switching unit (130) in the apparatus for simplification of input signal (the apparatus) according to an exemplary embodiment of the present disclosure will be described.

The switching unit (130) of the apparatus may include a switching controller (131) and a 2-bit switch (132).

The switching controller (131) can extract only the state signal in response to each mode from the first and second inputs. The switch controller (131) may be formed by D flip-flop, two AND elements and one OR element, but may be realized by other various elements in addition thereto.

The 2-bit switch (132) may output a pulse signal to a first output when addition calculation is performed using a signal of the switch controller (131) and an output of the second detector (120), and output a pulse signal to a second output when deduction calculation is performed. That is, the 2-bit switch (132) may output a pulse signal in response to the addition calculation or the deduction calculation outputted by the second detector (120) by dividing the pulse signal to an addition calculation pulse and a deduction pulse signal, using, as a control signal, a state signal showing the addition and deduction states at the switch controller (131). A universal output port of MPU (30) may be used for control of logic circuit of the apparatus for simplification of input signal according to an exemplary embodiment of the present disclosure.

Figures 10, 11:
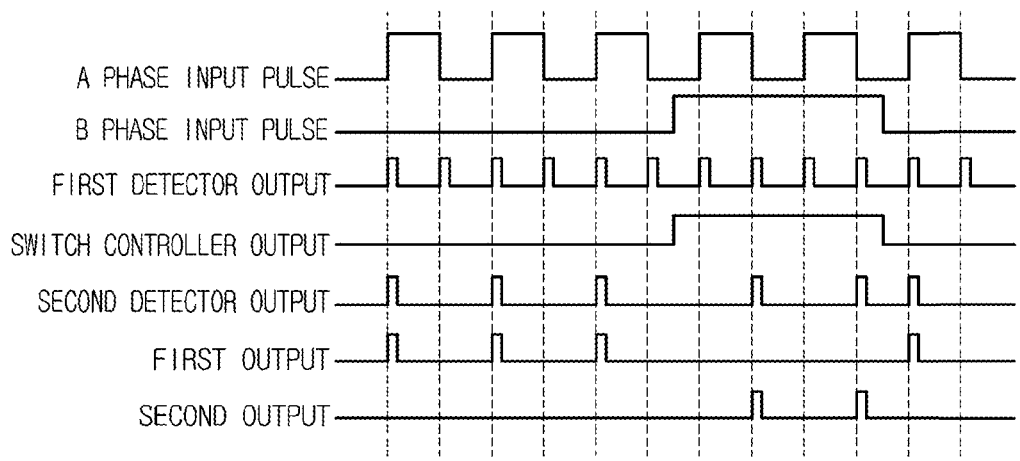
FIG. 10 is a schematic view illustrating a universal output port value, per input mode, of MPU (30) for logic circuit control in an apparatus (100) for simplification of input signal according to an exemplary embodiment of the present disclosure.
FIGS. 11 to 16 are schematic views illustrating waveforms of outputs of first detector (110), a second detector (120), a switch controller (131) and a 2-bit switch (132) at first to sixth modes.

FIG. 10 is a schematic view illustrating a universal output port value, per input mode, of MPU (30) for logic circuit control in an apparatus (100) for simplification of input signal according to an exemplary embodiment of the present disclosure.

The universal output port value of FIG. 10 operates to a designed circuit of FIG. 8 and may be changed by a circuit change to an appropriate logic value. That is, when inner circuits of the first detector, the second detector and switching unit which are basic elements of the present disclosure are changed, it is preferable that the universal output port value of FIG. 10 be appropriately changed.

FIGS. 11 to 16 are schematic views illustrating waveforms of outputs of first detector (110), a second detector (120), a switch controller (131) and a 2-bit switch (132) at first to sixth modes.

Referring to FIG. 11, in case of first mode, i.e., in case of 1-phase/2-input/1-multiplication mode, it can be noted that an output of the first detector (110) generates a single pulse at every rising or falling edge on A phase which is a reference signal of first mode. Furthermore, it can be noted that an output of the second detector (120) is detected only in case of falling edge on A phase when a B phase signal is OFF and a rising edge of A phase or a B phase signal is ON.

It can be also noted that an output of the switch controller (131) equally outputs a B phase signal in response to B phase state which is a state signal of first mode.

Furthermore, it can be noted that an output of 2-bit switch (132), outputted by using, as input, an output of the second detector (120) and an output of the switch controller (131), is classified into a first output and a second output, and an output signal of the second detector (120) is outputted by being divided according to addition calculation and deduction calculation in response to the output of the switch controller (131).

Figure 12:
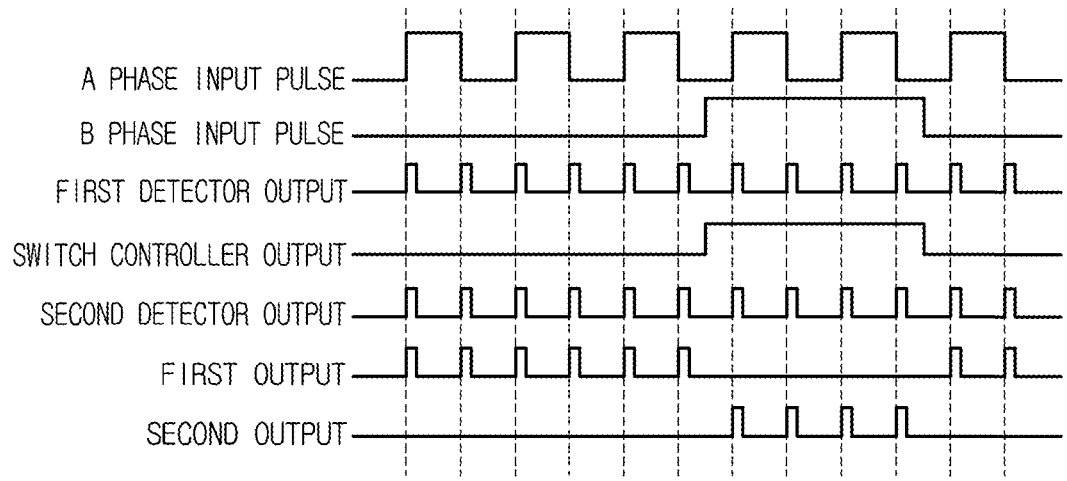

Referring to FIG. 12, it can be noted that, in case of second mode, i.e., in case of 1-phase/2-input/2-multiplication mode, an output of the second detector (120) generates a single pulse at every rising or falling edge on A phase which is a reference signal of second mode. Furthermore, an output of the second detector (120) is a pulse string of rising or falling edge performing an actual addition or deduction calculation among the outputs of the first detector (110).

However, in case of 1-phase/2-input/2-multiplication mode, an output of the first detector (110) and an output of the second detector (120) are same, because one calculation is performed out of the addition and deduction calculations in response to B phase signal at every rising or falling edge on A phase.

It can be noted that an output of the switch controller (131) is same as the B phase signal which is state signal of second mode, and an output of the 2-bit switch (132) which is a final output is divided to a first output and a second output, and an output signal of the second detector (120) is outputted by being divided to addition or deduction calculation in response to the output of the switch controller (131).

Figure 13:
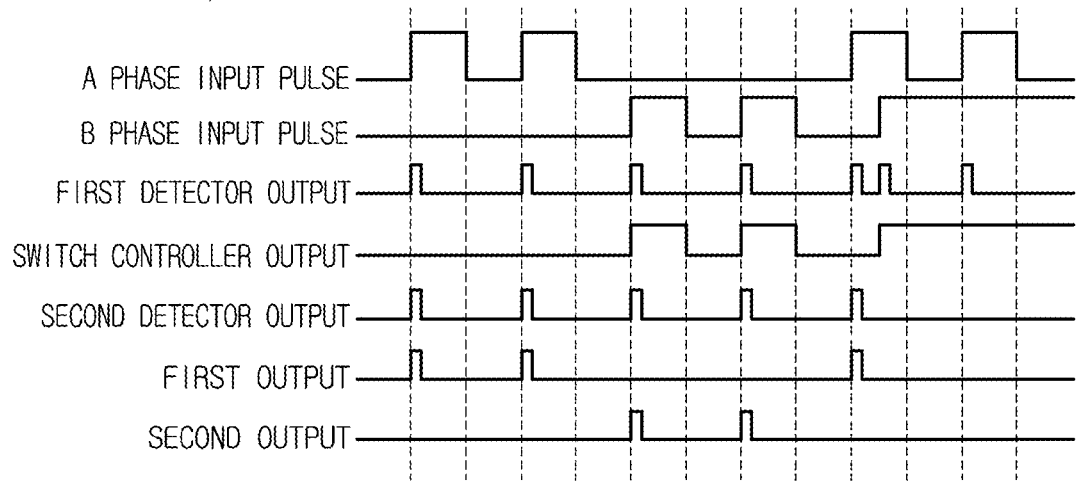

Referring to FIG. 13, it can be noted that, in case of third mode, i.e., in case of CW/CCW mode, an output of the first detector (110) is an A phase signal and a B phase signal each of which is a reference signal of third mode, and addition or deduction calculation is performed only at the rising edges thereof such that a single signal is generated at every rising edge on A phase and every falling edge of B phase.

Furthermore, it can be also noted that an output of the second detector (120) is such that only a pulse of rising edge on A phase is detected when A phase and B phase signals which are state signals of third mode are OFF, and only a pulse of rising edge on B phase is detected when an A phase signal is OFF. An output of the switch controller (131) is outputted as a toggling signal whenever A phase signal and B phase signal which are state signals of third mode are changed.

It can be noted that an output of the 2-bit switch (132) which is a final output, is divided to a first output and a second output, and an output signal of the second detector (120) is outputted by being divided to addition and deduction calculation in response to output of the switch controller (131).

Figure 14:
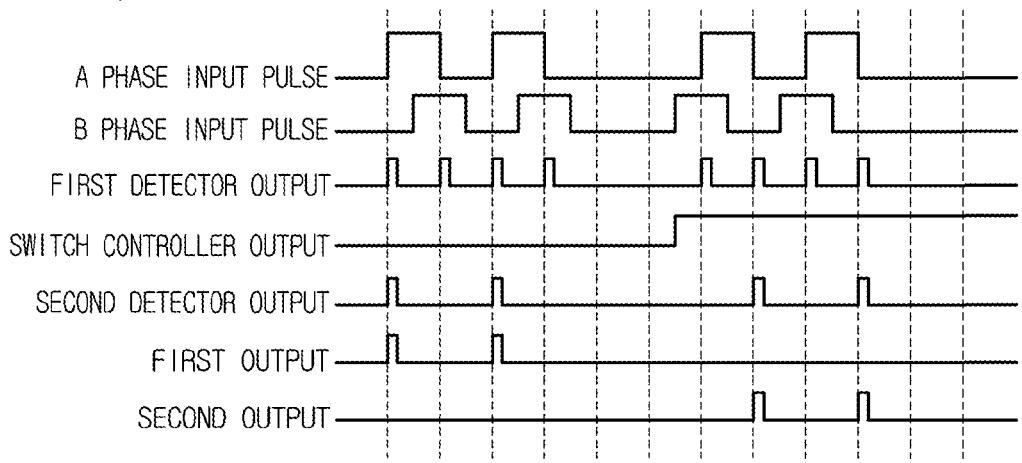

Referring to FIG. 14, it can be noted that in case of fourth mode, i.e., in case of 2-phase/1-multiplication mode, an output of the first detector (110) generates a pulse at every rising or falling edge of A phase signal which is a reference signal of fourth mode.

Furthermore, it can be noted that an output of the second detector (120) is such that remaining pulses are excluded except for when A phase is ahead of B phase in response to a phase difference between A phase and B phase which are state signals, and a rising edge is generated on A phase, and when B phase is ahead of A phase and a falling edge is generated on A phase.

An output of the switch controller (131) is such that a control signal is outputted capable of discerning addition and deduction states when a low signal is outputted when A phase is ahead of B phase, and a high signal is outputted when B phase is ahead of A phase.

It can be noted that an output of the 2-bit switch (132) is divided to a first output and a second output, and an output signal of the second detector (120) is outputted by being divided to addition and deduction calculations in response to an output of the switch controller (131).

Figure 15:
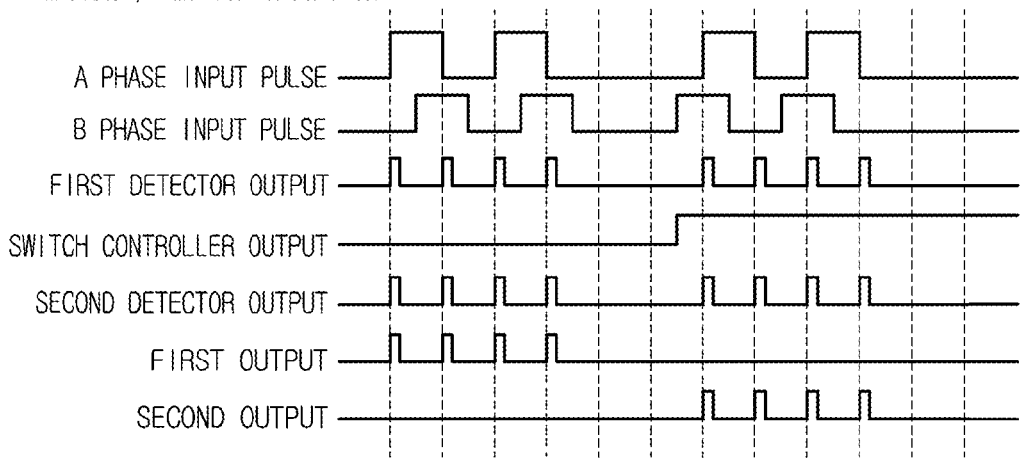

Referring to FIG. 15, it can be noted that, in case of fifth mode, i.e., in case of 2-phase/2-multification mode, an output of the first detector (110) generates a pulse at every rising and falling edge of A phase signal which is a reference signal of the fifth mode.

Furthermore, an output of the second detector (120) is such that remaining pulses are excluded except for when A phase is ahead of B phase in response to a phase difference between A phase and B phase which are state signals, and a rising edge is generated on A phase, and when B phase is ahead of A phase and a falling edge is generated on A phase.

An output of the switch controller (131) is such that a control signal is outputted capable of discerning addition and deduction states when a low signal is outputted when A phase is ahead of B phase, and a high signal is outputted when B phase is ahead of A phase.

It can be noted that an output of the 2-bit switch (132) is divided to a first output and a second output, and an output signal of the second detector (120) is outputted by being divided to addition and deduction calculations in response to an output of the switch controller (131).

Figure 16:
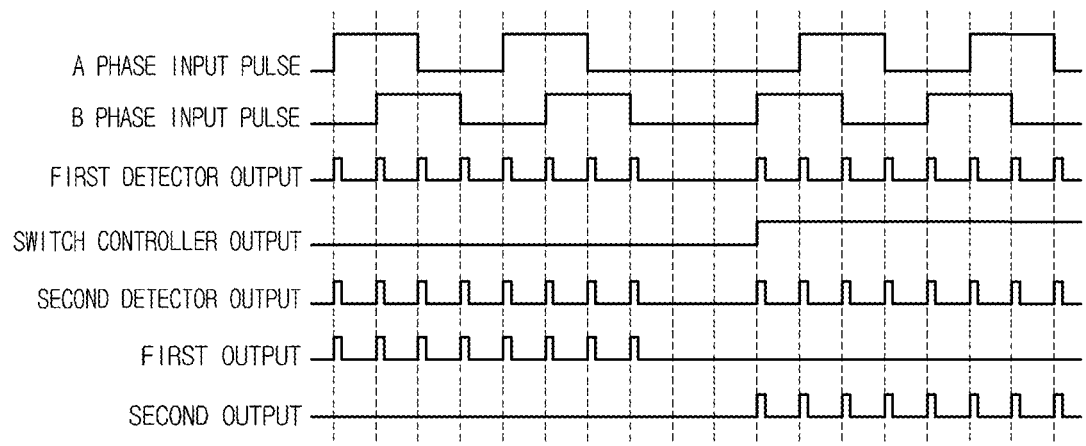

Referring to FIG. 16, in case of sixth mode, i.e., in case of 2-phase/4-multification mode, an output of the first detector (110) generates a pulse at every rising and falling edge of A phase and B phase which are reference signals of the sixth mode. Furthermore, it can be noted that an output of the second detector (120) is remained only with a pulse of a moment where actual addition or deduction calculation is performed out of output of the first detector (110).

However, in case of sixth mode, an output of the first detector (110) and an output of the second detector (120) are same, because addition calculation or deduction calculation is performed at every rising or falling edge on A phase.

It can be noted that an output of the switch controller (131) outputs a low signal and a high signal respectively by dividing a case where a phase on A phase is ahead of a phase of B phase, and a case where a phase on B phase is ahead of a phase of A phase.

It can be noted that an output of the 2-bit switch (132) is divided to a first output and a second output, and an output of the second detector (120) is outputted by being divided to addition calculation and deduction calculation in response to the output of the switch controller (131).

As discussed in the foregoing, the apparatus for simplification of input signal according to an exemplary embodiment of the present disclosure can change an input signal of six modes to an addition signal formed with a single pulse and a deduction signal.

Although the present disclosure has been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for simplification of input signal configured to input, to an MPU (Micro Processing Unit), an output of an input circuit at a PLC high speed counter module by converting the input to a single signal, the apparatus comprising:

a first detector configured to output a single pulse in response to a rising edge or a falling edge by detecting the rising edge or the falling edge of a reference signal, which is a reference of adding or deducting calculation in response to an operation mode of the high speed counter module;

a second detector configured to detect, from an output of the first detector, a pulse of rising edge or falling edge configured to perform an actual adding or deducting calculation in response to an operation mode of the high speed counter module; and a switching unit configured to output an output of the second detector using the adding or deducting calculation.

2. The apparatus of claim 1, wherein a control signal is transmitted to the first, second detectors and the switching unit by using a general output port of the MPU.

3. The apparatus of claim 1, wherein the operation mode includes any one mode of a first mode of 1-phase/2-input/1-multiplication method, a second mode of 1-phase/2-input/2-multiplication method, a third mode of CW/CCW method, a fourth mode of 2-phase/1-multiplication method, a fifth mode of 2-phase/2-multiplication method and a sixth mode of 2-phase/4-multiplication method.

4. The apparatus of claim 1, wherein the switching unit includes a 2-bit switch configured to perform a one-on-one connection or a cross connection in response to a control signal by receiving a 2-bit input, and a switch controller configured to control the 2-bit switch by outputting through adding or deducting calculation in response to the operation mode.

5. The apparatus of claim 1, wherein the first detector includes a first oscillation unit configured to output a signal pulse by detecting a rising edge of a first input, a second oscillation unit configured to output a signal pulse by detecting a falling edge of a first input, a third oscillation unit configured to output a signal pulse by detecting a rising edge of a second input, a fourth oscillation unit configured to output a signal pulse by detecting a falling edge of a second input, and an edge detector configured to detect only an output of a reference signal from the first to fourth oscillation units in response to the operation mode.

6. The apparatus of claim 5, wherein the edge detector removes an input which is not a reference signal in response to the operation mode.

7. The apparatus of claim 5, wherein the edge detector combines outputs corresponding to the reference signal in response to the operation mode.

* * * * *